United States Patent
Dick et al.

(10) Patent No.: US 8,368,288 B2
(45) Date of Patent: Feb. 5, 2013

(54) ACTUATOR UNIT FOR AN INJECTION SYSTEM OF AN INTERNAL COMBUSTION ENGINE

(75) Inventors: Jürgen Dick, Laaber (DE); Hellmut Freudenberg, Grossberg (DE); Richard Pirkl, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 355 days.

(21) Appl. No.: 12/669,071

(22) PCT Filed: Jul. 15, 2008

(86) PCT No.: PCT/EP2008/059204
§ 371 (c)(1),
(2), (4) Date: Jan. 14, 2010

(87) PCT Pub. No.: WO2009/010501
PCT Pub. Date: Jan. 22, 2009

(65) Prior Publication Data
US 2010/0194244 A1  Aug. 5, 2010

(30) Foreign Application Priority Data
Jul. 16, 2007 (DE) .......................... 10 2007 033 033

(51) Int. Cl.
*H01L 41/083* (2006.01)
(52) U.S. Cl. .................... 310/328; 123/478; 239/102
(58) Field of Classification Search ................ 310/328
See application file for complete search history.

(56) References Cited

U.S. PATENT DOCUMENTS

| 4,284,263 | A |   | 8/1981  | Newcomb ................. 251/129 |
|-----------|---|---|---------|-------------------------------|
| 4,471,256 | A |   | 9/1984  | Igashira et al. .......... 310/328 |
| 4,553,059 | A |   | 11/1985 | Abe et al. ................ 310/328 |
| 5,740,969 | A | * | 4/1998  | Hoffmann et al. ......... 239/533.2 |
| 6,313,568 | B1| * | 11/2001 | Sullivan et al. ........... 310/346 |
| 7,032,833 | B2| * | 4/2006  | Bocking ................... 239/102.2 |
| 7,762,236 | B2| * | 7/2010  | Frick et al. .............. 123/472 |
| 8,100,346 | B2| * | 1/2012  | Venkataraghavan et al. .......... 239/102.2 |
| 2004/0061003 | A1 |   | 4/2004 | Bocking ................... 239/533.2 |
| 2011/0315123 | A1| * | 12/2011 | Frick et al. .............. 123/478 |

FOREIGN PATENT DOCUMENTS

DE  2917933  11/1979

(Continued)

OTHER PUBLICATIONS

International Search Report and Written Opinion for Application No. PCT/EP2008/059204 (12 pages), Oct. 30, 2008.

(Continued)

*Primary Examiner* — Jaydi San Martin
(74) *Attorney, Agent, or Firm* — King & Spalding L.L.P.

(57) ABSTRACT

In an actuator unit for an injection system of an internal combustion engine, the difference in the longitudinal extension when a change of temperature of the piezoelectric actuator element occurs affecting the actuator unit is equalized compared to the actuator housing due to different thermal expansion coefficient values in that a fastening element is arranged on the actuator housing. The fastening element is made of a different material than the actuator housing and thus affects a force acting counter to the change of length of the actuator housing.

15 Claims, 1 Drawing Sheet

FOREIGN PATENT DOCUMENTS

| | | |
|---|---|---|
| DE | 19538791 A1 | 4/1997 |
| DE | 19909106 | 9/2000 |
| DE | 10149915 A1 | 4/2003 |
| DE | 10303855 | 8/2004 |
| EP | 0869278 | 4/1998 |
| JP | 54147525 A | 11/1979 |
| JP | 7310842 A | 11/1995 |
| JP | 11280932 | 10/1999 |

OTHER PUBLICATIONS

Chinese Office Action, Chinese Patent Application No. 200880024681.8, 17 pages.

* cited by examiner

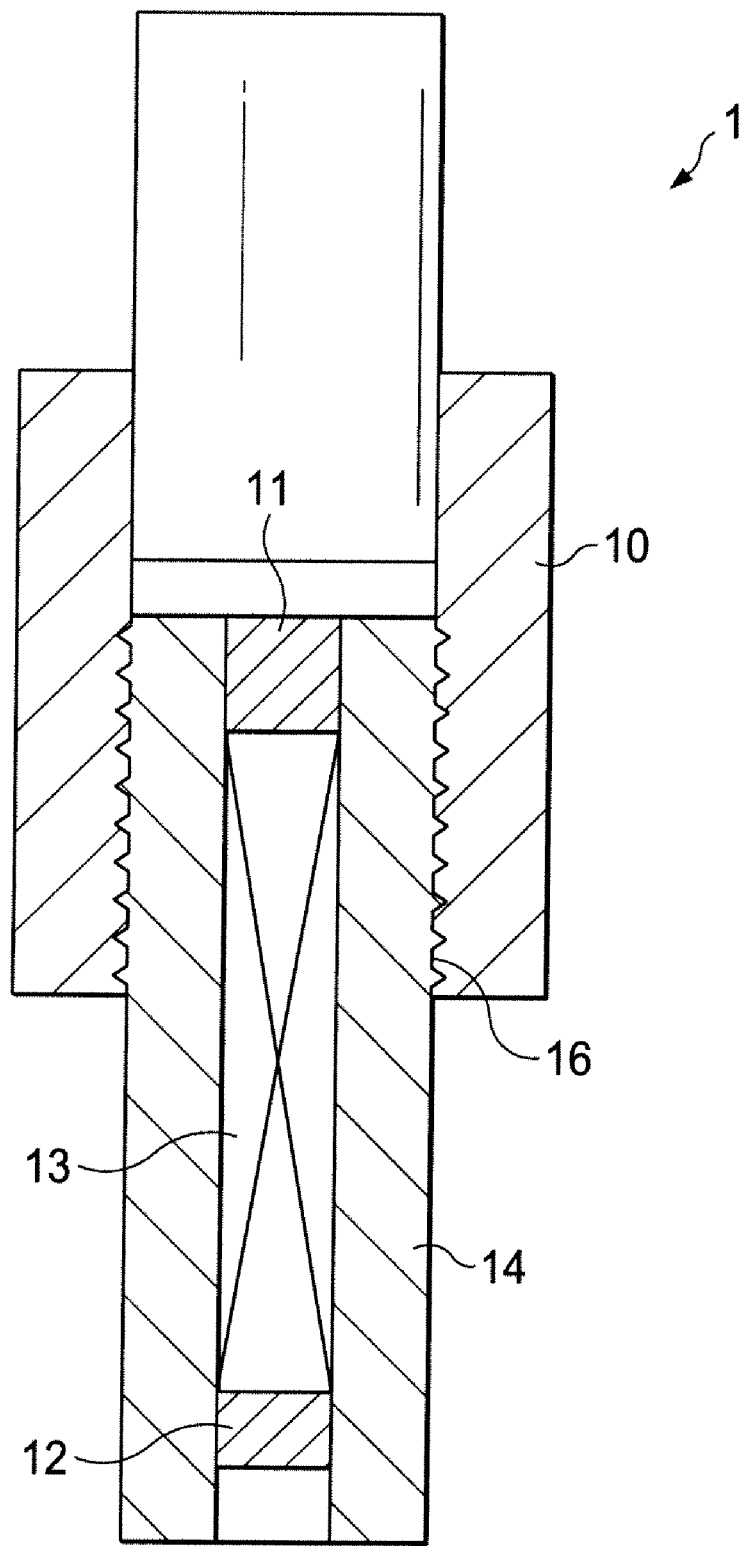

ACTUATOR UNIT FOR AN INJECTION SYSTEM OF AN INTERNAL COMBUSTION ENGINE

CROSS-REFERENCE TO RELATED APPLICATIONS

This application is a U.S. National Stage Application of International Application No. PCT/EP2008/059204 filed Jul. 15, 2008, which designates the United States of America, and claims priority to German Application No. 10 2007 033 033.4 filed Jul. 16, 2007, the contents of which are hereby incorporated by reference in their entirety.

TECHNICAL FIELD

The invention relates to an actuator unit for an injection system of an internal combustion engine.

BACKGROUND

Actuator units with piezoelectric actuator elements are used, for example, for injecting fuel into combustion chambers of internal combustion engines. The piezoelectric actuator elements preferably consist of ceramic and are disposed in an actuator housing consisting, for example, of invar. As the different materials of the actuator housing and piezoelectric actuator element have different values for the respective coefficient of thermal expansion, different length changes of the piezoelectric actuator element and actuator housing may occur in the event of a change in the temperature acting on the actuator unit. This may shift the position of the piezoelectric actuator element with respect to a final control element so that the operative connection between the piezoelectric actuator element and the final control element is affected accordingly.

Patent specification DE 199 09 106 C2 discloses an actuator unit in which length changes resulting from different coefficients of thermal expansion for the different materials of actuator housing and piezoelectric actuator element can be equalized by the actuator housing being composed of an inner, middle and outer sleeve, at least two sleeves having a different coefficient of thermal expansion. The materials of the sleeves are selected such that, as a result of the different coefficients of thermal expansion of the individual sleeves, the different length changes in the actuator housing and piezoelectric actuator element are equalized.

SUMMARY

According to various embodiments, an alternative solution for an actuator unit can be provided by means of which different linear expansions of the actuator housing and piezoelectric actuator element can be equalized as simply as possible.

According to an embodiment, an actuator unit comprises an actuator housing enclosing a piezoelectric actuator element, wherein the actuator housing and the piezoelectric actuator element are made from different materials with correspondingly different coefficients of thermal expansion, and a fastening element disposed on the actuator housing whose material is different from the material of the actuator housing and from the material of the piezoelectric actuator element in respect of the coefficient of thermal expansion, wherein the actuator housing and fastening element materials are selected such that one of the materials has a higher coefficient of thermal expansion than the coefficient of thermal expansion of the piezoelectric actuator element and the other material has a lower coefficient of thermal expansion than the coefficient of thermal expansion of the piezoelectric actuator element, and the fastening element engages in a thread provided on the actuator housing.

According to a further embodiment, the fastening element can be clamped axially on the actuator housing. According to a further embodiment, the fastening element can be embodied as a clamping nut. According to a further embodiment, the length of the part of the clamping nut engaging in the thread may depend on the coefficient of thermal expansion of the piezoelectric actuator element. According to a further embodiment, the fastening element can be made of steel, the actuator housing of invar and the piezoelectric actuator element of ceramic.

BRIEF DESCRIPTION OF THE DRAWINGS

The invention will now be described in greater detail with reference to the accompanying drawings in which:

FIG. 1: shows a sectional view of an actuator unit.

DETAILED DESCRIPTION

The advantages achieved with the various embodiments are in particular that, on the basis of a known coefficient of thermal expansion of the piezoelectric actuator element, the differential linear expansion of the actuator housing and piezoelectric actuator element in the axial direction is equalized by disposing on the actuator housing a fastening element producing a force-compensating effect. This is provided by selecting the coefficient of thermal expansion of the actuator housing and fastening element such that one of the materials has a coefficient of thermal expansion that is higher than the coefficient of thermal expansion of the piezoelectric actuator element, and the other material has a coefficient of thermal expansion that is lower than the coefficient of thermal expansion of the piezoelectric actuator element.

According to a further embodiment, it may be provided that the fastening means is embodied as a clamping nut and is fastened to a thread provided on the actuator housing. Disposing the clamping nut on the actuator housing is advantageous in that the different length changes of the actuator housing and piezoelectric actuator element take place without deformation of the actuator unit, thereby enabling the actuator unit to be re-machined inexpensively and quickly.

According to a further embodiment, the equalization of the different linear expansions of the actuator housing and piezoelectric actuator element can be finely adjusted via the length of the part of the clamping nut engaging in the thread. The length of the part of the clamping nut engaging in the thread of the actuator housing depends on the coefficient of thermal expansion of the piezoelectric element. The advantage is therefore that different length changes of the same material, which may occur e.g. in the case of the same material being supplied by different manufacturers, are prevented solely by changing the length of the part of the clamping nut engaging in the thread of the actuator housing.

FIG. 1 shows a sectional view of an actuator unit. The actuator unit 1 has a piezoelectric actuator element 13 which is disposed inside an actuator housing 14. The piezoelectric actuator element 13 is connected at one end to a head element 11 and at the opposite end to a base element 12. A fastening element 10 is also disposed on the actuator housing 14. Said fastening element 10 is, for example, a clamping nut. In an advantageous embodiment of the actuator unit, the piezoelectric actuator element 13 consists of ceramic, the actuator housing 14 of nickel steel, and the fastening element 10 of steel.

Because of the different coefficients of thermal expansion for the materials of the piezoelectric actuator element 13 and actuator housing 14, in the event of a change in temperature a differential length change of the actuator housing 14 and piezoelectric actuator element 13 of the actuator unit occurs in the axial direction. The position of the piezoelectric actuator element 13 may now change in relation to a final control element not shown in FIG. 1. This may cause an operative connection between the piezoelectric actuator element 13 and the final control element not shown in FIG. 1 to be influenced such that, in the case of injection valves, for example, control of the amount of fuel to be injected will be impaired.

The differential length change between the piezoelectric actuator element 13 and actuator housing 14 occurring in the actuator unit 1 in the event of a temperature change is equalized by the fastening element 10. Equalization of the differential linear expansion by the fastening element 10 takes place insofar as a force component is exerted on the actuator housing 14 by the fastening element 10 in the axial direction, counteracting the movement of the actuator housing 14. As the fastening element 10 is embodied as a clamping nut, for example, the force exerted on the actuator housing 14 is greater the longer the part of the clamping nut engaging in the thread of the actuator housing 14.

The fastening element 10, the actuator housing 14 and the piezoelectric actuator element 13 are preferably made of different materials having a different coefficient of thermal expansion. To enable the different length changes between the actuator housing 1 and the fastening element 10, in relation to the length change of the piezoelectric actuator element 13, to be equalized, the materials of the fastening element 10 and actuator housing 1 are selected such that one of the two materials has a higher coefficient of thermal expansion than the coefficient of thermal expansion of the piezoelectric actuator element 13, and the other material has a lower coefficient of thermal expansion than the coefficient of thermal expansion of the piezoelectric actuator element 13.

The case shall now be considered that the coefficient of thermal expansion of the fastening element 10 is lower than the coefficient of thermal expansion of the piezoelectric actuator element 13, and at the same time the coefficient of thermal expansion of the actuator housing 14 is higher than the coefficient of thermal expansion of the piezoelectric actuator element 13. Therefore, because of the higher coefficient of thermal expansion of the actuator housing 14, an excessively large linear expansion of the actuator housing 14 compared to the piezoelectric actuator element 13 occurs. This excessively large linear expansion compared to the piezoelectric actuator element 13 is equalized by the fastening element 10 in that now, because of the lower coefficient of thermal expansion of the fastening element 10, a force opposing the axial direction of movement of the actuator housing 14 is exerted on the actuator housing 14.

In some embodiments, the fastening element 10 is embodied as a clamping nut and is fastened to a thread 16 provided on the actuator housing. The equalization of the different linear expansions of the actuator housing 14 and piezoelectric actuator 13 can be finely adjusted by adjusting the length of the part of the clamping nut engaging in the thread 16. The length of the part of the clamping nut engaging in the thread 16 of the actuator housing depends on the coefficient of thermal expansion of the piezoelectric element.

What is claimed is:

1. An actuator unit comprising
   an actuator housing enclosing a piezoelectric actuator element, wherein the actuator housing and the piezoelectric actuator element are made from different materials with correspondingly different coefficients of thermal expansion,
   a fastening element disposed on the actuator housing whose material is different from the material of the actuator housing and from the material of the piezoelectric actuator element in respect of the coefficient of thermal expansion, and
   wherein the actuator housing and fastening element materials are selected such that one of the materials has a higher coefficient of thermal expansion than the coefficient of thermal expansion of the piezoelectric actuator element and the other material has a lower coefficient of thermal expansion than the coefficient of thermal expansion of the piezoelectric actuator element, and the fastening element engages in a thread provided on the actuator housing.

2. The actuator unit according to claim 1, wherein the fastening element is clamped axially on the actuator housing.

3. The actuator unit according to claim 1, wherein the fastening element is embodied as a clamping nut.

4. The actuator unit according to claim 3, wherein the clamping nut and the actuator housing are configured such that the length of the part of the clamping nut that threadably engages the actuator housing corresponds to a predetermined coefficient of thermal expansion of the piezoelectric actuator element.

5. The actuator unit according to claim 1, wherein the fastening element is made of steel, the actuator housing of invar and the piezoelectric actuator element of ceramic.

6. An actuator unit comprising
   a piezoelectric actuator element made from a first material having a first coefficients of thermal expansion,
   an actuator housing made from a second material having a second coefficients of thermal expansion, the housing enclosing the piezoelectric actuator element,
   a fastening element made from a third material having a third coefficients of thermal expansion, the fastening element being disposed on the actuator housing, and
   wherein the actuator housing and fastening element materials are selected such that one of the materials has a higher coefficient of thermal expansion than the coefficient of thermal expansion of the piezoelectric actuator element and the other material has a lower coefficient of thermal expansion than the coefficient of thermal expansion of the piezoelectric actuator element, and the fastening element engages on the actuator housing;
   wherein the fastening element engages in a thread provided on the actuator housing.

7. The actuator unit according to claim 6, wherein the fastening element is clamped axially on the actuator housing.

8. The actuator unit according to claim 6, wherein the fastening element is embodied as a clamping nut.

9. The actuator unit according to claim 8, wherein the clamping nut and the actuator housing are configured such that the length of the part of the clamping nut that threadably engages the actuator housing corresponds to a predetermined coefficient of thermal expansion of the piezoelectric actuator element.

10. The actuator unit according to claim 6, wherein the fastening element is made of steel, the actuator housing of invar and the piezoelectric actuator element of ceramic.

11. An method for assembling an actuator unit comprising the steps of:
- enclosing a piezoelectric actuator element with a actuator housing, wherein the actuator housing and the piezoelectric actuator element are made from different materials with correspondingly different coefficients of thermal expansion,
- engaging a fastening element on the actuator housing whose material is different from the material of the actuator housing and from the material of the piezoelectric actuator element in respect of the coefficient of thermal expansion, wherein the actuator housing and fastening element materials are selected such that one of the materials has a higher coefficient of thermal expansion than the coefficient of thermal expansion of the piezoelectric actuator element and the other material has a lower coefficient of thermal expansion than the coefficient of thermal expansion of the piezoelectric actuator element;
  wherein the fastening element engages in a thread provided on the actuator housing.

12. The method according to claim 11, wherein the fastening element is clamped axially on the actuator housing.

13. The method according to claim 11, wherein the fastening element is embodied as a clamping nut.

14. The method according to claim 13, further including selectively engaging the clamping nut and the actuator housing such that a length of the part of the clamping nut engaging in the thread corresponds to a predetermined coefficient of thermal expansion of the piezoelectric actuator element.

15. The method according to claim 11, wherein the fastening element is made of steel, the actuator housing of invar and the piezoelectric actuator element of ceramic.

* * * * *